United States Patent
Lee et al.

(10) Patent No.: US 12,310,022 B2
(45) Date of Patent: May 20, 2025

(54) 3D CAPACITOR STACK AND METHOD OF FABRICATING THE STACK

(71) Applicant: Seoul National University R&DB FOUNDATION, Seoul (KR)

(72) Inventors: Jong-Ho Lee, Seoul (KR); Young-Tak Seo, Seongnam-si (KR); Soochang Lee, Seoul (KR); Seongbin Oh, Seoul (KR); Jangsaeng Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 534 days.

(21) Appl. No.: 17/888,778

(22) Filed: Aug. 16, 2022

(65) Prior Publication Data

US 2023/0057424 A1   Feb. 23, 2023

Related U.S. Application Data

(60) Provisional application No. 63/233,939, filed on Aug. 17, 2021.

(51) Int. Cl.
*H10B 43/27* (2023.01)
*G06N 3/063* (2023.01)
(Continued)

(52) U.S. Cl.
CPC ............ *H10B 43/27* (2023.02); *G06N 3/063* (2013.01); *G11C 16/08* (2013.01); *H10B 43/35* (2023.02);
(Continued)

(58) Field of Classification Search
CPC .................................. H10B 43/27; H10B 43/35
See application file for complete search history.

(56) References Cited

U.S. PATENT DOCUMENTS

| 9,716,137 B1 * | 7/2017 | Hu ........................ H10B 41/40 |
| 2021/0028184 A1 * | 1/2021 | Kim ...................... H10B 41/41 |

OTHER PUBLICATIONS

Si, et al., A Twin-8T SRAM Computation-In-Memory Macro for Multiple-Bit CNN-Based Machine Learning, 2019 IEEE International Solid-State Circuits Conference.
(Continued)

*Primary Examiner* — Douglas M Menz
(74) *Attorney, Agent, or Firm* — CANTOR COLBURN LLP

(57) ABSTRACT

Provided is a 3D capacitor stack and a method for manufacturing the same. The 3D capacitor stack comprises: a drain line electrode having a pillar shape provided in a vertical direction on a substrate surface; a plurality of first insulating layers positioned in first region of an outer circumferential surface of the drain line electrode; a plurality of drains positioned in second regions of an outer circumferential surface of the drain line electrode; a plurality of insulator stacks positioned on side surfaces of the drains; and a plurality of word lines positioned on side surfaces of the insulator stacks. The word lines surrounded by the insulator stacks are positioned on the side of the drains, first insulating layers and drains are alternately stacked on the outer circumferential surface of the drain line electrode, and the word lines surrounded by the insulator stacks and the first insulating layers are alternately stacked; the drain, the word line and the insulator stack constitute a capacitor device, and the capacitor devices electrically isolated from each other by the first insulating layers are vertically stacked to form a stack structure.

20 Claims, 15 Drawing Sheets

(51) Int. Cl.
    *G11C 16/08*          (2006.01)
    *H10B 43/35*         (2023.01)
    *H10B 43/40*         (2023.01)
    *H10B 51/20*         (2023.01)
    *H10B 51/40*         (2023.01)
    *G11C 16/04*         (2006.01)

(52) U.S. Cl.
    CPC ............. *H10B 43/40* (2023.02); *H10B 51/20* (2023.02); *H10B 51/40* (2023.02); *G11C 16/0483* (2013.01)

(56) References Cited

OTHER PUBLICATIONS

Sun, et al., XNOR-RRAM: A Scalable and Parallel Resistive Synaptic Architecture for Binary Neural Networks, Design, Automation And Test in Europe, 2018.

\* cited by examiner

FIG. 4
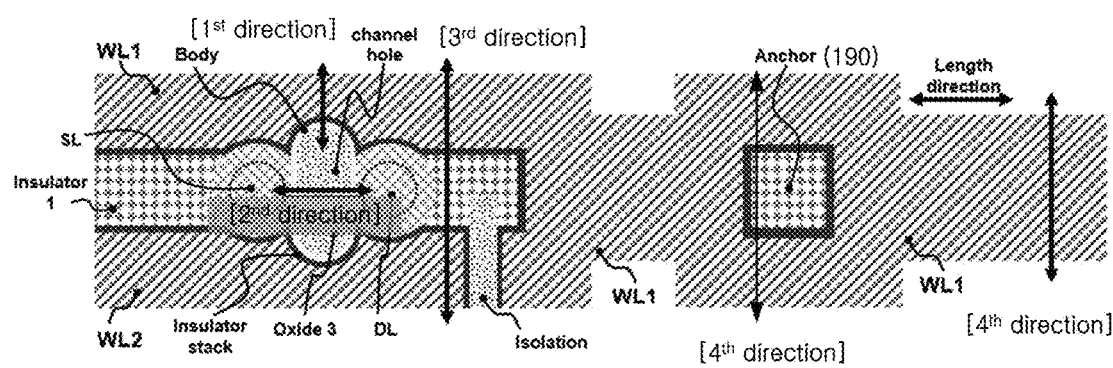
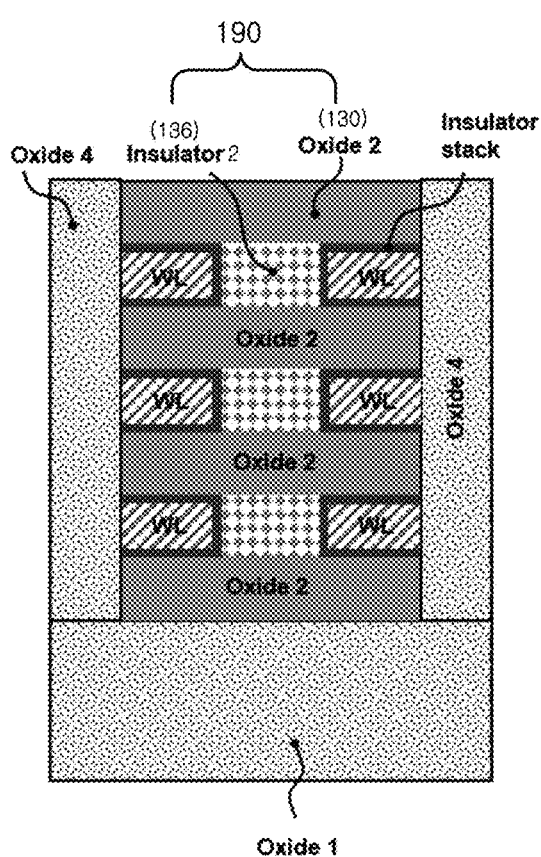
FIG. 5A
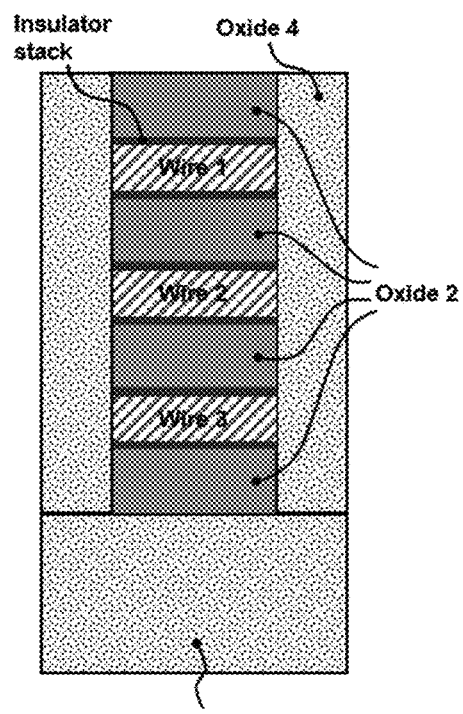
FIG. 5B (a1) Oxide dep & landing pad dep

[2nd direction]

(a2) Oxide dep & CMP

[2nd direction]

(a3) ON stack dep

[2nd direction]

(a) CH dummy poly-Si strip

[2nd direction]

(b) CH nitride recess

[2nd direction]

(c) CH poly-Si dep

[2nd direction]

(d) CH oxide fill & CMP

[2nd direction]

(e) CH oxide etch

[2nd direction]

(f) Body electrode dep

[2nd direction]

3D CAPACITOR STACK AND METHOD OF FABRICATING THE STACK

TECHNICAL FIELD

The present invention relates to a three-dimensional capacitor stack and a method for manufacturing the same, and more specifically, to a three-dimensional capacitor stack capable of improving the degree of integration and improving operational reliability by implementing the capacitor in a three-dimensional stackable form and a method for manufacturing the same.

BACKGROUND ART

A capacitor is a component used to obtain a capacitance, and is an important device constituting an electronic circuit. In particular, since the three-dimensional synapse array circuit has a large number of synapse devices, it is necessary to integrate a large number of capacitors together for their operation. In addition, in order to provide various functions in the three-dimensional synapse array circuit, variable capacitors need to be integrated together.

Accordingly, the present invention provides a three-dimensional capacitor stack capable of operating with low power and high reliability while increasing the degree of integration.

SUMMARY OF THE INVENTION

In order to solve the problems of the prior art described above, an object of the present invention is to provide a three-dimensional capacitor stack capable of implementing variable capacitance with high-capacity in a three-dimensional stack structure.

Another object of the present invention is to provide a method for manufacturing the three-dimensional capacitor stack.

According to one aspect of the present invention, there is provided a three-dimensional capacitor stack, which comprises: a substrate having an upper surface formed of a first oxide layer; a channel hole positioned on the substrate in the vertical direction and provided in a form of a pillar shape, the inside of which is filled with an insulating material; a semiconductor body positioned on the outer circumferential surface of the channel hole and made of a semiconductor material; a plurality of first insulating layers positioned on an outer circumferential surface of the semiconductor body; a plurality of sources positioned on a first side surface of an outer circumferential surface of the semiconductor body; a plurality of drains positioned on a second side surface of an outer circumferential surface of the semiconductor body opposite to the first side surface; a plurality of word lines positioned on a third side surface of the outer peripheral surface of the semiconductor body located between the source and the drain; a plurality of insulator stacks positioned between the word line and the semiconductor body; a source line electrode positioned on the substrate in the vertical direction and provided in a form of a pillar shape, and electrically connected to the plurality of sources; and a drain line electrode positioned on the substrate in the vertical direction and provided in a form of a pillar shape, and electrically connected to the plurality of drains, wherein the first insulating layers and the sources are alternately stacked on a first side surface of the outer peripheral surface of the semiconductor body, the first insulating layers and drains are alternately stacked on the second side surface of the outer peripheral surface of the semiconductor body, and the first insulating layer and word lines surrounded by the insulator stack are alternately stacked on the third side of the outer circumferential surface of the semiconductor body; the semiconductor body, the source, the drain, the word line and the insulator stack located on the same layer on the side of the channel hole constitute a capacitor device; and the capacitor devices electrically isolated from each other by the first insulating layers are vertically stacked to form a stack structure.

In the three-dimensional capacitor stack according to the present invention, preferably a region in which the capacitor is formed among the side surfaces of the channel hole protrudes and extends toward the source, drain, and word line, the semiconductor body is provided only on the side surface of the protruding and extended channel hole and is not provided on the non-protruding side surface of the channel hole, so that adjacent word lines of capacitor devices stacked in a stack structure are electrically isolated from each other.

In the three-dimensional capacitor stack according to the present invention, preferably the three-dimensional capacitor stack further comprises: a body landing pad located in the first region of the first oxide layer, made of an electrically conductive material, and electrically connected to the semiconductor body; a source electrode landing pad located in the second region of the first oxide layer, made of an electrically conductive material, and electrically connected to a source line electrode; and a drain electrode landing pad located in a third region of the first oxide layer, made of an electrically conductive material, and electrically connected to a drain line electrode.

According to another aspect of the present invention, there is provided a three-dimensional capacitor stack, which comprises: a substrate having an upper surface formed of a first oxide layer; a drain line electrode positioned on the substrate in the vertical direction, provided in a form of a pillar shape, and made of a conductive material; a plurality of first insulating layers positioned in a first region of an outer circumferential surface of the drain line electrode; a plurality of drains positioned in a second region of an outer peripheral surface of the drain line electrode; a plurality of insulator stacks positioned on side surfaces of the drain; and a plurality of word lines positioned on side surfaces of the insulator stacks, wherein the word lines surrounded by the insulator stacks are located on the side surfaces of the drains, first insulating layers and drains are alternately stacked on the outer circumferential surface of the drain line electrode, and the word lines surrounded by the insulator stack and the first insulating layers are alternately stacked; the drain, the word line and the insulator stack located on the same layer on the outer circumferential surface of the drain line electrode constitutes a capacitor device; and the capacitor devices electrically isolated from each other by the first insulating layers are vertically stacked to form a stack structure.

According to another aspect of the present invention, there is provided a three-dimensional capacitor stack, which comprises: a substrate having an upper surface formed of a first oxide layer; a body electrode positioned on the substrate in the vertical direction, provided in a form of a pillar shape, and made of a conductive material; a plurality of first insulating layers positioned on an outer circumferential surface of the body electrode; a plurality of third oxide layers positioned on an outer circumferential surface of the body electrode; a plurality of semiconductor bodies positioned on the surfaces of the third oxide layers, made of a semiconductor material, and partially in contact with the body electrode to be electrically connected; a plurality of insulator stacks positioned on side surfaces of the semiconductor bodies; and a plurality of word lines positioned on side surfaces of the insulator stacks, wherein the word lines surrounded by an insulator stacks are provided on a side surface of the semiconductor body, the first insulating layers and the semiconductor bodies are alternately stacked on an outer circumferential surface of the body electrode, and the first insulating layers and the word lines surrounded by the insulator stack are alternately stacked; the semiconductor body, the word line and the insulator stack located on the same layer of the outer circumferential surface of the body electrode constitutes a capacitor device; and the capacitor devices electrically isolated from each other by the first insulating layers are vertically stacked to form a stack structure.

In the three-dimensional capacitor stack according to the present invention, preferably the insulator stack is composed of a single insulating layer or a stack structure in which a plurality of layers are stacked; and when configured in a stack structure, the insulator stack comprises at least a charge storage layer and an insulating layer, at least a ferroelectric layer and an insulating layer, at least a resistance change layer and an insulating layer, or at least a phase change layer and an insulating layer.

In the three-dimensional capacitor stack according to the present invention, preferably the three-dimensional capacitor stack is configured to change the capacitance value of the capacitor by providing positive or negative charges in the charge storage layer.

In the three-dimensional capacitor stack according to the present invention, preferably the three-dimensional capacitor stack further comprises an anchor provided on the substrate at a position spaced apart from the stack structure by a predetermined distance, and formed by alternately stacking the plurality of first insulating layers and the plurality of second insulating layers, wherein the first insulating layer and the second insulating layer are made of materials having different etch ratios.

In the three-dimensional capacitor stack according to the present invention, preferably the three-dimensional capacitor stack further comprises a CMOS integrated circuit used as a peripheral circuit under the substrate.

According to another aspect of the present invention, there is provided a method of manufacturing a three-dimensional capacitor stack comprising the following steps: (a) alternately forming first insulating layers and second insulating layers on a substrate to form a stacked structure, etching predetermined regions of the stacked structure to form an etch hole and a trench for stack isolation, forming a passivation material in the etched regions of the stacked structure, and planarizing the surface; (b) selectively etching the passivation material filled in the etch hole, selectively etching the second insulating layer in the etched region to be recessed, and forming the drains and drain line electrodes made of a semiconductor material doped with a high concentration of impurities; and (c) selectively etching the passivation material filled in the trench for stack isolation, etching the second insulating layers from the exposed side of the trench for stack isolation to be recessed, forming insulator stacks on the surfaces of the recessed spaces, and forming a plurality of word lines made of a conductive material and separated by layers, wherein capacitor devices electrically isolated from each other by the first insulating layers are vertically stacked to form a stack structure;

According to another aspect of the present invention, there is provided a method of manufacturing a three-dimensional capacitor stack comprising the following steps: (a) alternately forming first insulating layers and second insulating layers on a substrate to form a stacked structure, etching predetermined regions of the stacked structure to form an etch hole and a trench for stack isolation, forming a passivation material in the etched regions of the stacked structure, and planarizing the surface; (b) selectively etching the passivation material filled in the etch hole, selectively etching the second insulating layers from the surface of the etched region to be recessed, and forming a semiconductor body made of a semiconductor material doped with a high concentration of impurities; (c) forming third oxide layers by filling, planarizing, and isotropically etching the etch hole in which the semiconductor body is formed; (d) forming a body electrode made of a conductive material in the etch hole; (e) selectively etching the passivation material filled in the trench for stack isolation, selectively etching second insulating layers from the exposed surface of the trench for stack isolation to be recessed, forming an insulator stack on the surfaces of the recessed spaces, and forming a plurality of word lines made of a conductive material and separated by layers, wherein capacitor devices electrically isolated from each other by the first insulating layers are vertically stacked to form a stack structure.

In the method of manufacturing a three-dimensional capacitor stack according to the present invention, preferably the insulator stack is composed of a single insulating layer or a stack structure in which a plurality of layers are stacked; and when configured in a stack structure, the insulator stack comprises at least a charge storage layer and an insulating layer, at least a ferroelectric layer and an insulating layer, at least a resistance change layer and an insulating layer, or at least a phase change layer and an insulating layer.

In the method of manufacturing a three-dimensional capacitor stack according to the present invention, preferably, in the step (a), in order to provide an anchor made of the multilayer structure at a predetermined location spaced apart from the stack structure by a predetermined distance, an etch hole is not formed in the predetermined area of the stack structure.

In the method of manufacturing a three-dimensional capacitor stack according to the present invention, preferably the first insulating layer and the second insulating layer are made of materials having different etch ratios.

In the 3D capacitor stack according to the present invention having the above-described structure, a plurality of capacitors are vertically stacked, and each capacitor is isolated from each other by an oxide layer. In addition, by applying a voltage to the word line constituting each capacitor to perform a program operation or an erase operation, positive or negative charges may be stored in the insulator stack constituting the capacitor. Accordingly, in the 3D capacitor stack according to the present invention, the capacitance value between the body and the word line can be adjusted, and the capacitance of each capacitor can be varied.

In addition, since the 3D capacitor stack according to the present invention is manufactured in the same process as the three-dimensional synapse stack, it is possible to easily provide the variable capacitance with a high-capacity to the peripheral circuit part of the synapse array formed of the three-dimensional capacitor stack.

In addition, the 3D capacitor stack according to the present invention can significantly improve the degree of integration by implementing a plurality of capacitor devices in a three-dimensional stacked type.

BRIEF DESCRIPTION OF THE DRAWINGS

FIG. 4 is a cross-sectional view exemplarily showing a three-dimensional capacitor stack having an anchor in the three-dimensional capacitor stack according to the first embodiment of the present invention; and FIGS. 5A and 5B are cross-sectional views taken in the third direction and the fourth direction of FIG. 4.

DETAILED DESCRIPTION

Hereinafter, a structure of a three-dimensional capacitor stack and a method of manufacturing the same according to the present invention will be described in detail with reference to the accompanying drawings.

EMBODIMENT 1

Figure 1:
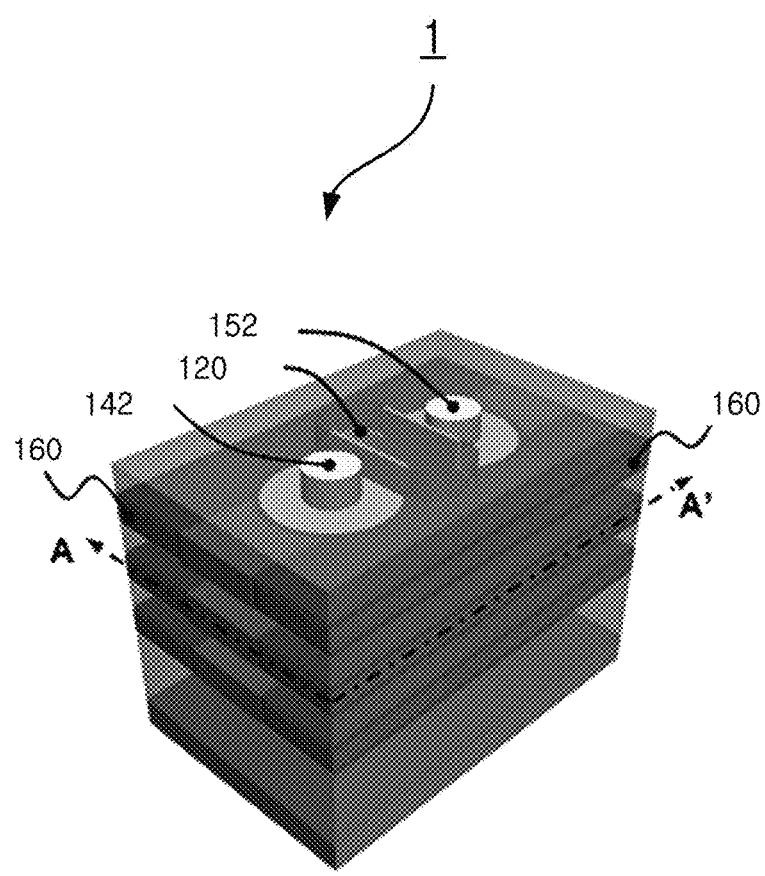
FIG. 1 is a perspective view showing a three-dimensional capacitor stack according to a preferred embodiment of the present invention.
Figure 2:
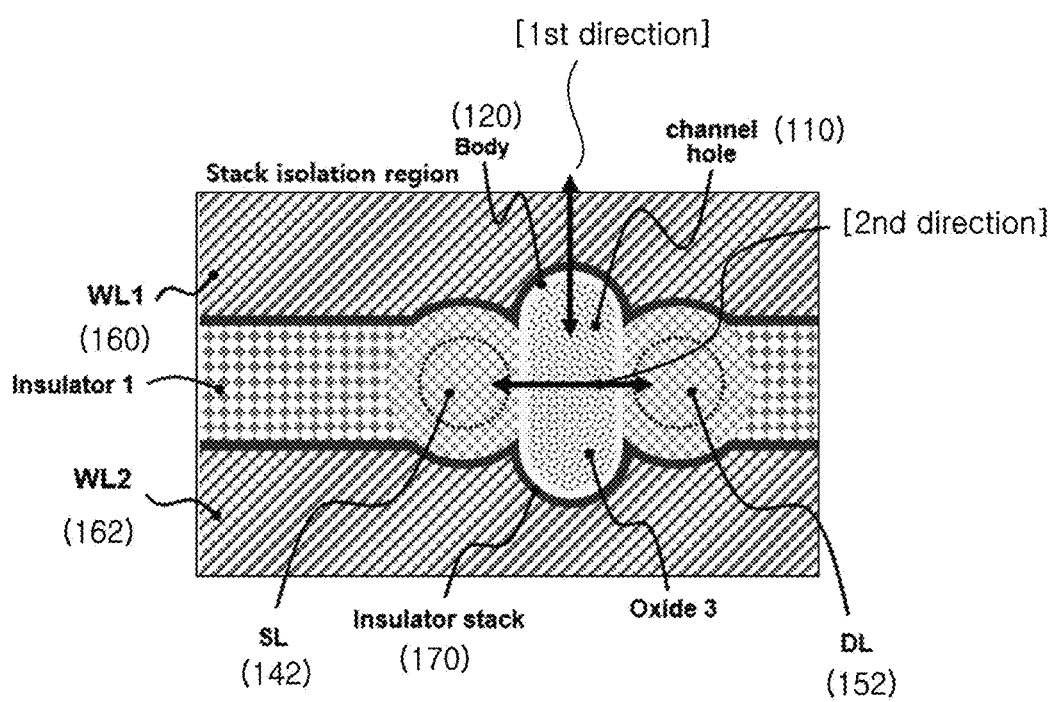
FIG. 2 is a cross-sectional view taken in the direction A-A' of FIG. 1.
Figure 3A:
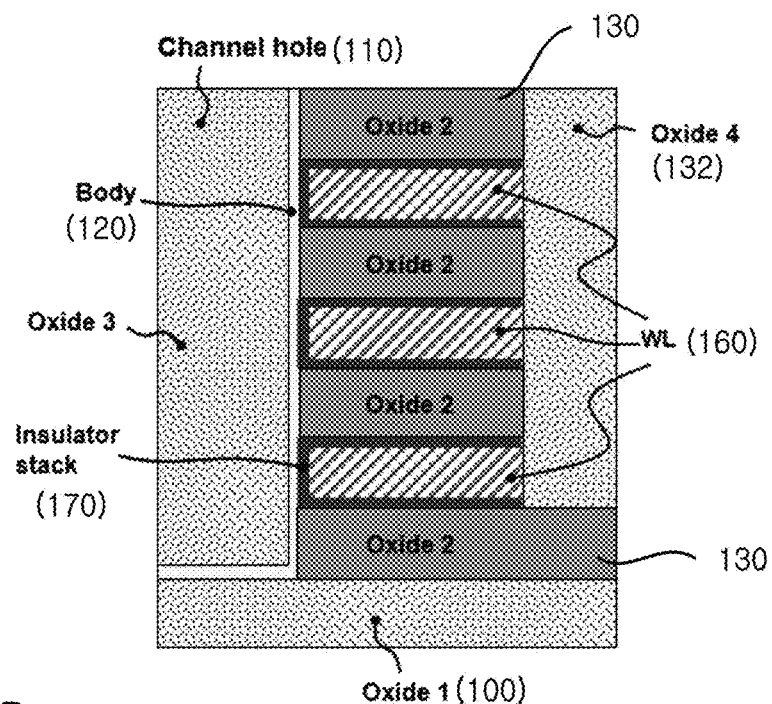
FIG. 3A is a cross-sectional view in the first direction of FIG. 2.
Figure 3B:
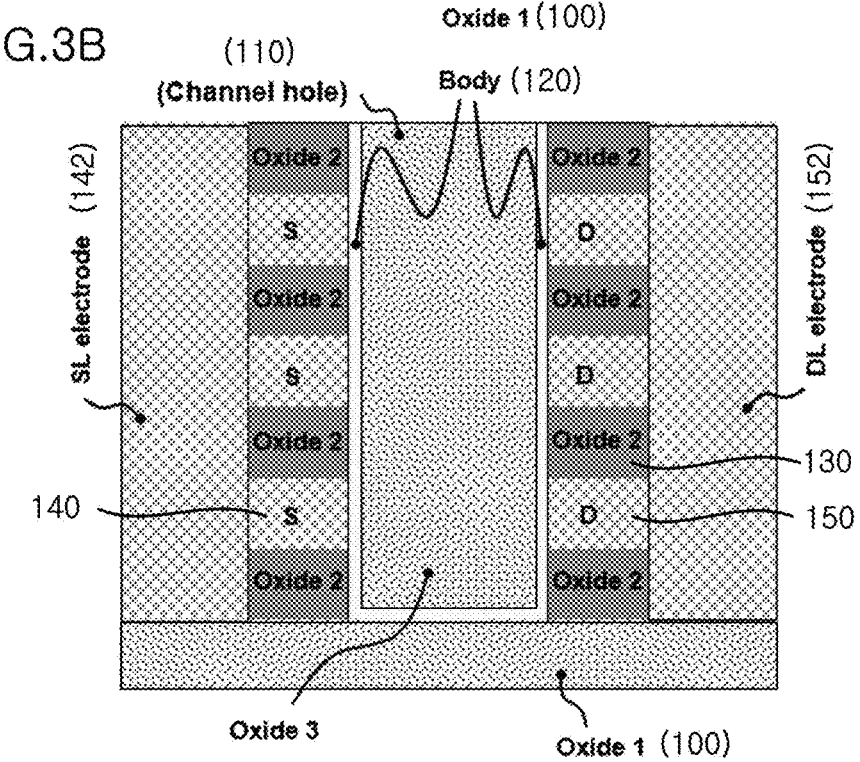
FIG. 3B is a cross-sectional view taken in a second direction of FIG. 2.

FIG. 1 is a perspective view showing a three-dimensional capacitor stack according to a first embodiment of the present invention; FIG. 2 is a cross-sectional view taken in the direction A-A' of FIG. 1; FIG. 3A is a cross-sectional view in the first direction of FIG. 2; and FIG. 3B is a cross-sectional view taken in a second direction of FIG. 2.

Hereinafter, the structure and operation of the 3D capacitor stack 1 according to the first embodiment of the present invention will be described in detail with reference to FIGS. 1 to 3. For convenience, in the present specification, a three-dimensional capacitor stack will be described on the assumption that the capacitor has a stacked structure of three layers. However, the three-dimensional capacitor stack according to the present invention is not limited to a stacked structure of three layers, and may be manufactured as a stacked structure including a plurality of layers having more capacitors, if necessary.

Referring to FIGS. 1 to 3, a three-dimensional capacitor stack 1 according to a first embodiment of the present invention includes a substrate (not shown), a channel hole 110, a semiconductor body 120, and a plurality of first insulating layers 130, a plurality of sources 140, a plurality of drains 150, a source line electrode 142, a drain line electrode 152, a plurality of word lines 160, and a plurality of insulator stacks 170. A semiconductor body, a source, a drain, an insulator stack, and a word line positioned on the same layer on the outer circumferential surface of the channel hole constitute a capacitor device. In addition, the capacitor devices formed in each layer are electrically isolated from each other by the first insulating layers and stacked in a vertical direction, thereby constituting a three-dimensional capacitor stack as a whole. The 3D capacitor stack having the above-described structure is electrically isolated from the adjacent 3D capacitor stack by further including the stack isolation layer 132 on the side surfaces of the word lines. The stack isolation layer may be formed of a fourth oxide layer (Oxide 4). Hereinafter, each of the above-described components will be described in detail.

The substrate (not shown) is formed by having a first oxide layer (Oxide 1) 100 on the surface, and the 3D capacitor stack according to the present invention is provided along the vertical direction on the first oxide layer 100 of the substrate. The channel hole 110 is located on the surface of the first oxide layer of the substrate, and is a hole formed in a pillar shape in a direction perpendicular to the surface of the substrate. The inside of the channel hole is filled with an oxide material having electrical insulation to form a third oxide layer (Oxide 3).

The semiconductor body 120 is positioned on the surface of the channel hole, and is provided by applying a semiconductor material to the surface of the channel hole in the form of a thin layer. The semiconductor body may be made of a semiconductor material such as polysilicon, poly-SiGe, metal oxide, or the like. The semiconductor body 120 having the above-described structure serves as a channel during device operation.

The plurality of first insulating layers (Oxide 2) 130 are positioned on the outer circumferential surface of the semiconductor body, and are stacked apart from each other along the vertical direction. The first insulating layer may be formed of, for example, an oxide layer (Oxide 2). The first insulating layers are disposed between the stacked capacitors to electrically isolate the stacked capacitors from each other on the side surface of the channel hole along the vertical direction.

The plurality of sources 140 are located on the first side surface of the outer circumferential surface of the semiconductor body. The plurality of drains 150 are positioned on a second side surface of an outer circumferential surface of the semiconductor body opposite to the first side surface in the second direction. The plurality of insulator stacks 170 are positioned on a third side surface of the outer peripheral surface of the semiconductor body positioned between the sources and the drains. The plurality of word lines 160 are positioned on side surfaces of the insulator stacks. As shown in FIGS. 2, 3A and 3B, first insulating layers and sources are alternately stacked on a first side surface of the outer peripheral surface of the semiconductor body, and first insulating layers and drains are alternately stacked on a second side surface of the outer peripheral surface of the semiconductor body. Each of the word lines is surrounded by an insulator stack and disposed on a third side surface of the semiconductor body, and the word lines surrounded by the insulator stacks and the first insulating layers are alternately stacked on a third side surface of the outer circumferential surface of the semiconductor body.

The source line electrode 142 is spaced apart from the first side surface of the outer peripheral surface of the semiconductor body by a predetermined distance, and has a pillar shape provided along a vertical direction on the substrate. A side surface of the source line electrode is electrically connected to the side surface of the plurality of sources. The drain line electrode 152 is spaced apart from the second side surface of the outer circumferential surface of the semiconductor body by a predetermined distance, and has a pillar shape provided along a vertical direction on the substrate. A side surface of the drain line electrode is electrically connected to contact with the plurality of drains.

The insulator stacks 170 are provided between at least the word lines and the semiconductor body, and may be further provided between the word lines and the first insulating layers. The insulator stack may be composed of a single layer or a stack structure in which at least two or more layers are stacked, and the insulator stack includes a layer that stores electric charges or causes polarization.

With the structure having the above-described configuration, the semiconductor body, the source, the drain, the insulator stack and the word line positioned on the same layer on the outer circumferential surface of the channel hole constitute a capacitor device. In addition, the capacitor devices formed in each layer are electrically isolated from each other by the first insulating layers and stacked, thereby constituting a three-dimensional capacitor stack as a whole.

Each of the capacitor devices having the above-described structure may store electric charges in an insulator stack positioned between the word line and the semiconductor body disposed between the source and the drain. According to the present invention, it is possible to provide a basic capacitor structure that can be effectively implemented in a three-dimensional stack structure, the degree of integration and the performance of the device can be improved by the above-described structure.

Meanwhile, the three-dimensional capacitor stack according to the present invention further includes an additional capacitor stack structure on the outer circumferential surface of the channel hole, thereby further improving the degree of integration. The additional capacitor stack structure further includes a plurality of additional word lines and a plurality of additional insulator stacks on a fourth side surface of the semiconductor body opposite to the third side surface along the first direction. The additional word lines are surrounded by the additional insulator stacks, and are alternately stacked with first insulating layers on a fourth side surface of the outer circumferential surface of the semiconductor body. In addition, additional insulator stacks are provided at least between the additional word lines and the semiconductor body.

A semiconductor body, a source, a drain, an additional insulator stack and an additional word line located in the same layer on the outer circumferential surface of the channel hole constitute additional capacitor devices. Further, the additional capacitor devices formed in each layer are electrically isolated from each other by the first insulating layers and stacked, thereby configuring an additional capacitor stack structure as a whole. As described above, in the three-dimensional capacitor stack according to the present invention, since the capacitor device and the additional capacitor device located on the same layer share a source and a drain, the degree of integration can be further improved. The three-dimensional capacitor stack having the above-described structure may be applied to various array architectures.

Meanwhile, it is preferable that the three-dimensional capacitor stack according to the present invention further includes an anchor 190 at a position spaced apart from the stack structure by a predetermined distance. In the process of selectively etching the second insulating layer, which is a part of the stack structure, to form the insulator stacks and the word lines during the manufacturing process of the capacitor stack, in order to prevent deformation or collapse of the structure, an anchor is provided at a portion of a position where word lines extending from the 3D capacitor stack are formed. The length, width, shape, and number of anchors can be varied in various ways depending on the structure.

FIG. 4 is a cross-sectional view exemplarily showing a three-dimensional capacitor stack having an anchor in the three-dimensional capacitor stack according to the first embodiment of the present invention, FIG. 5A is a cross-sectional view taken respectively in the third direction and the fourth direction of FIG. 4., and FIG. 5B is a cross-sectional view taken respectively in the fifth direction of FIG. 4.

The cross-sectional views in the third and fourth directions of FIG. 4 are the same. Referring to FIGS. 4 and 5, preferably the anchor 190 is formed by alternately stacking first insulating layers 130 and second insulating layers 136, and is spaced apart from the 3D capacitor stack by a predetermined distance, but is disposed at a position where the word lines are extended. Here, the first insulating layers 130 and the second insulating layers 136 are preferably made of materials having different etch ratios. Accordingly, the first insulating layer may be made of, for example, an oxide layer (Oxide 2), and the second insulating layer may be made of, for example, a nitride layer (Nitride).

Figure 6:
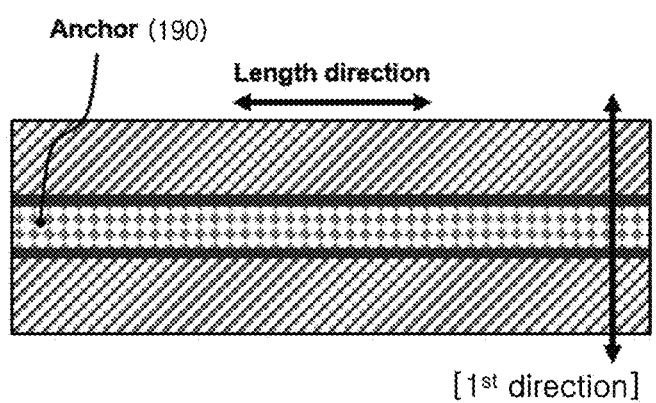
FIG. 6 is a cross-sectional view illustrating another embodiment of an anchor in the 3D capacitor stack according to the first embodiment of the present invention.
Figure 7:
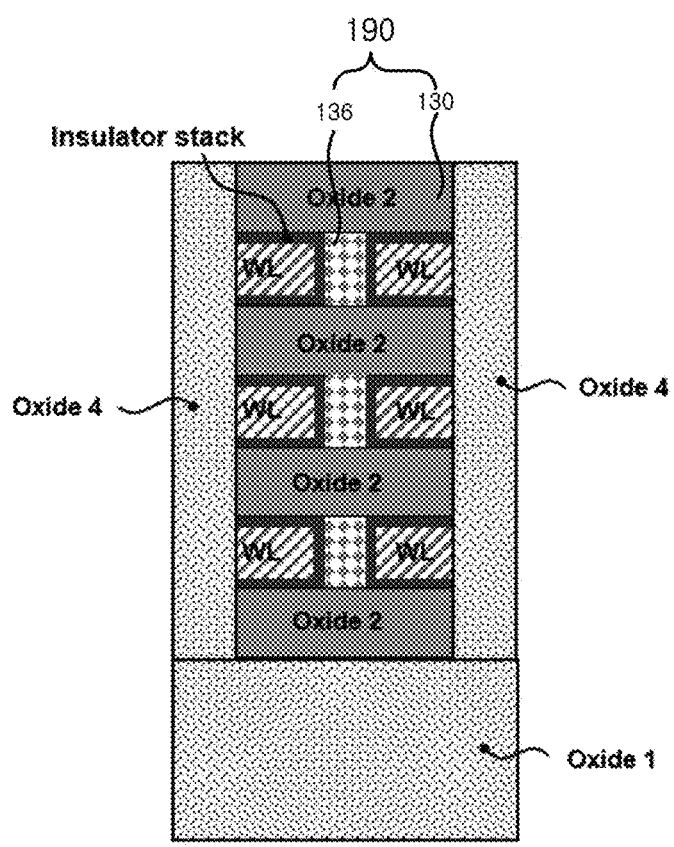
FIG. 7 is a cross-sectional view taken in the first direction of FIG. 6.

FIG. 6 is a cross-sectional view illustrating another embodiment of an anchor in the 3D capacitor stack according to the first embodiment of the present invention, and FIG. 7 is a cross-sectional view taken in the first direction of FIG. 6.

As shown in FIG. 4, the anchor 190 is configured by alternately stacking first insulating layers 130 and second insulating layers 136. In addition, the anchor may be formed in a rectangular shape on a portion of the word lines extending from the capacitor stack, or may be formed by extending a predetermined length from the stack isolation layers of the 3D capacitor stack along the longitudinal direction of the 3D capacitor stack as shown in FIGS. 6 and 7.

Meanwhile, the three-dimensional capacitor stack according to the first embodiment of the present invention may further include a body landing pad, a source electrode landing pad, and a drain electrode landing pad. The body landing pad is positioned in the first oxide layer positioned below the channel hole, and is electrically connected to the semiconductor body. The source electrode landing pad (SL electrode landing pad) is positioned in the first oxide layer positioned below the source line electrode, and is electrically connected to the source line electrode. In addition, the drain electrode landing pad (DL electrode landing pad) is positioned in the first oxide layer positioned below the drain line electrode, and is electrically connected to the drain line electrode.

The source and drain electrode landing pads and the body landing pad are made of an electrically conductive material, and for example, may be made of one of various metals, silicides, or semiconductor materials doped with impurities. The semiconductor material may include an amorphous semiconductor, a single crystal semiconductor, a polycrystalline semiconductor, and the like.

FIG. 8 are cross-sectional views illustrating another embodiment of a word line in the 3D capacitor stack according to the first embodiment of the present invention.

Figure 8A:
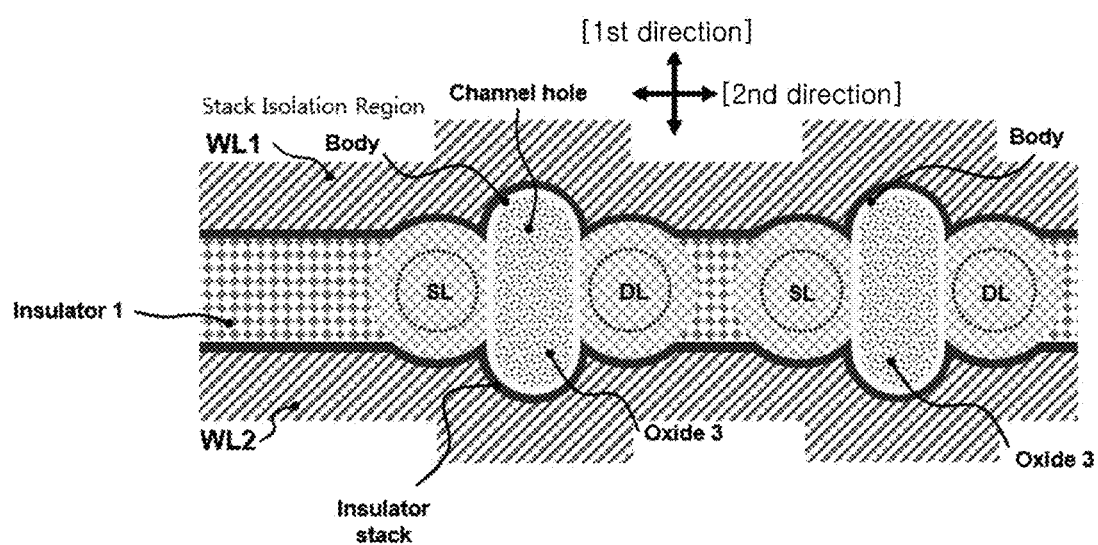
FIGS. 8A and 8B are cross-sectional views illustrating another embodiment of a word line in the 3D capacitor stack according to the first embodiment of the present invention.
Figure 8B:
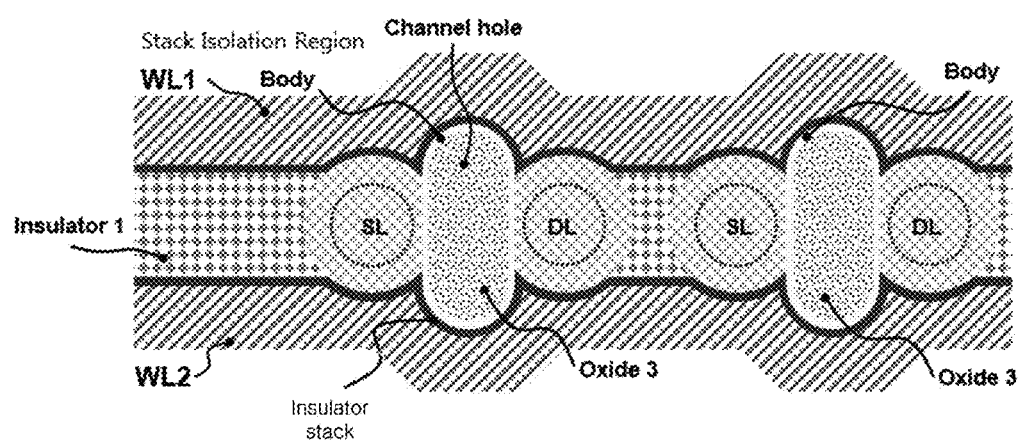

Referring to FIGS. 8A and 8B, the word lines WL1 and WL2 are preferably formed to have a predetermined length from at least the side surface of the channel hole. Accordingly, a region adjacent to the channel hole of the word line protrudes toward the fourth oxide layer compared to a region not adjacent to the channel hole. As a result, as shown in FIG. 8A, the point where the protruding area and the non-protruding area of the word line meet each other is formed in a direction perpendicular to each other, or as shown in FIG. 8B, a point where the protruding area and the non-protruding area of the word line meet may be inclined to each other at an arbitrary angle. As such, by configuring only the region adjacent to the channel hole among the word lines to protrude, adjacent three-dimensional capacitor stacks having different word lines can be arranged alternately in a zigzag form, and as a result, the degree of integration of the entire array structure can be improved. In addition, according to the embodiment of the word lines, damage to the channel hole, the source electrodes, and the drain electrodes adjacent to the word lines, can be minimized during the wet etching process for forming the word lines.

EMBODIMENT 2

Figure 9:
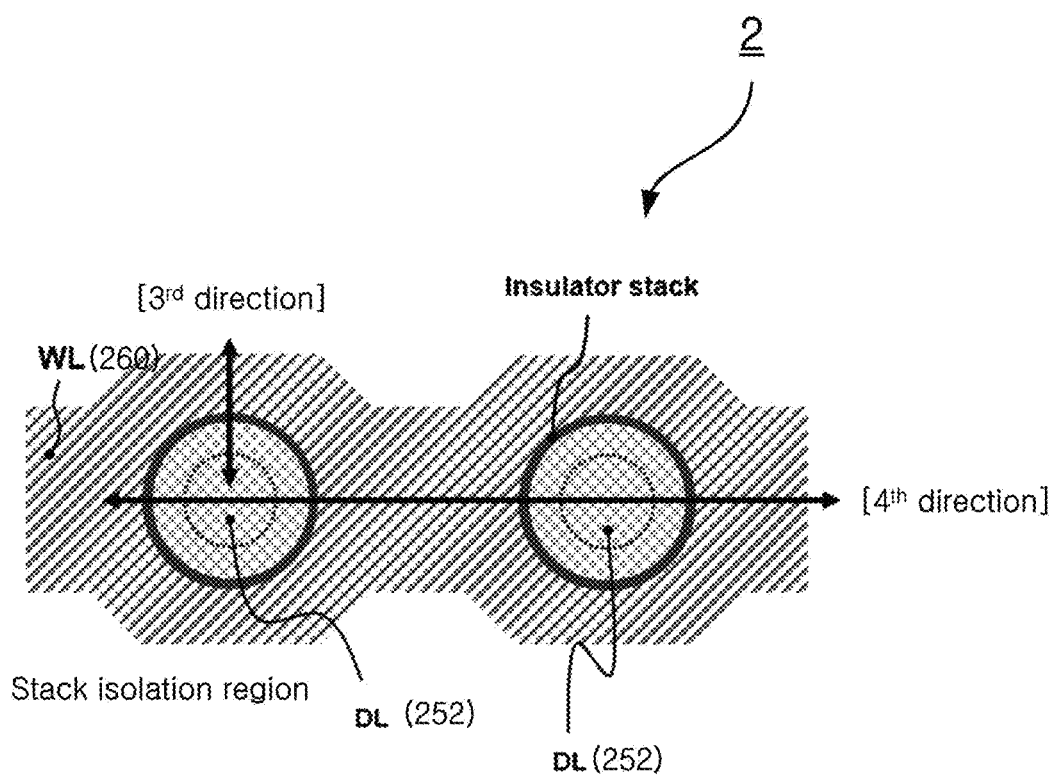
FIG. 9 is a cross-sectional view illustrating a three-dimensional capacitor stack according to a second embodiment of the present invention.
Figure 10:
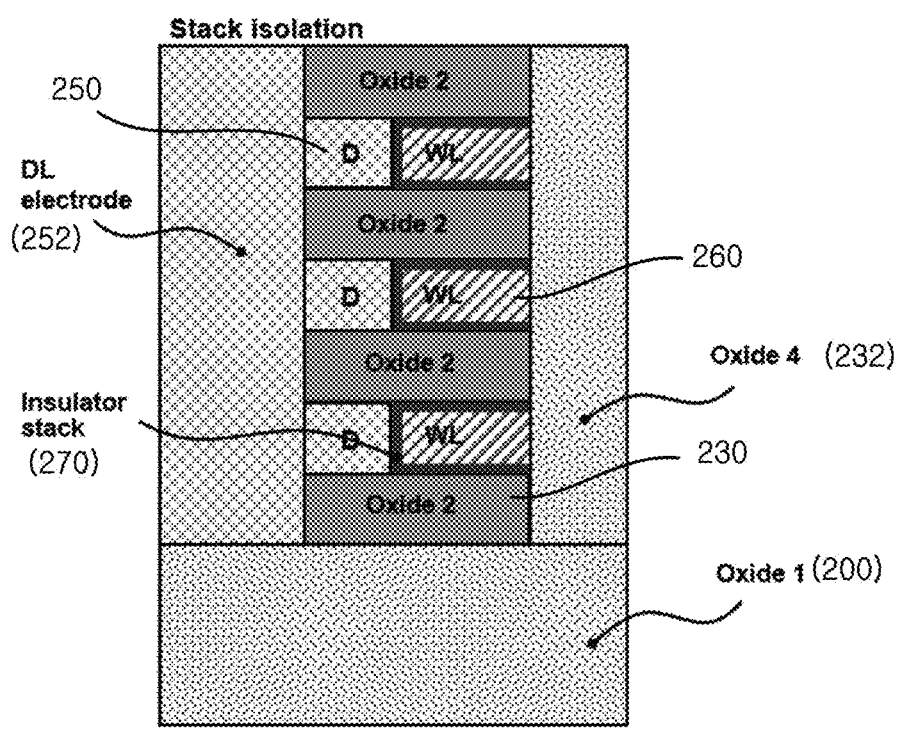
FIG. 10 is a cross-sectional view taken in the third direction of FIG. 9.

FIG. 9 is a cross-sectional view illustrating a three-dimensional capacitor stack according to a second embodiment of the present invention; and FIG. 10 is a cross-sectional view taken in the third direction of FIG. 9.

Referring to FIGS. 9 and 10, the 3D capacitor stack 2 according to the second embodiment of the present invention includes a substrate (not shown), a plurality of first insulating layers 230, a plurality of drains 250, and a drain line electrode 252, a plurality of word lines 260, and a plurality of insulator stacks 270. The drain, the insulator stack and the word line located in the same layer on the outer peripheral surface of the drain line electrode constitute a single capacitor device. In addition, the capacitor devices formed in each layer are electrically isolated from each other by the first insulating layers and stacked in a vertical direction, thereby constituting a three-dimensional capacitor stack as a whole. The three-dimensional capacitor stack having the above-described structure is electrically isolated from the adjacent three-dimensional capacitor stack by further including a stack isolation layer 232 on side surfaces of the word lines. The stack isolation layer may be formed of a fourth oxide layer (Oxide 4).

The substrate is formed with a first oxide layer (Oxide 1) 200 on the surface, and the 3D capacitor stack according to the present invention is provided along the vertical direction on the first oxide layer 200 of the substrate.

The drain line electrode 252 is positioned on the surface of the substrate, has a pillar shape provided in a direction perpendicular to the surface of the substrate, and is made of a semiconductor material doped with a high concentration of impurities or is made of a material having electrical conductivity.

The plurality of first insulating layers Oxide2 230 is positioned in a first region of an outer circumferential surface of the drain line electrode. The plurality of drains 250 are located in the second region of the outer peripheral surface of the drain line electrode, and protrude and extend from the second region of the outer peripheral surface of the drain line electrode. The plurality of insulator stacks 270 are positioned on the side surface of the drains, and the plurality of word lines 260 are positioned on the side surface of the insulator stacks.

The word lines are surrounded by the insulator stacks and are provided on the side of the drain, the first insulating layers and drains are alternately stacked on the outer circumferential surface of the drain line electrode, and the first insulating layers and the word lines surrounded by the insulator stack are alternately stacked with each other. In addition, the drain, the insulator stack, and the word line positioned on the same layer on the outer circumferential surface of the drain line electrode constitute a single capacitor device, and the capacitor devices electrically isolated from each other by the first insulating layers are vertically stacked to form a stack structure. The first insulating layers electrically isolate the stacked capacitor devices from each other.

Hereinafter, a method of manufacturing a 3D capacitor stack according to a second embodiment of the present invention will be described in detail with reference to FIG. 11.

Figure 11:
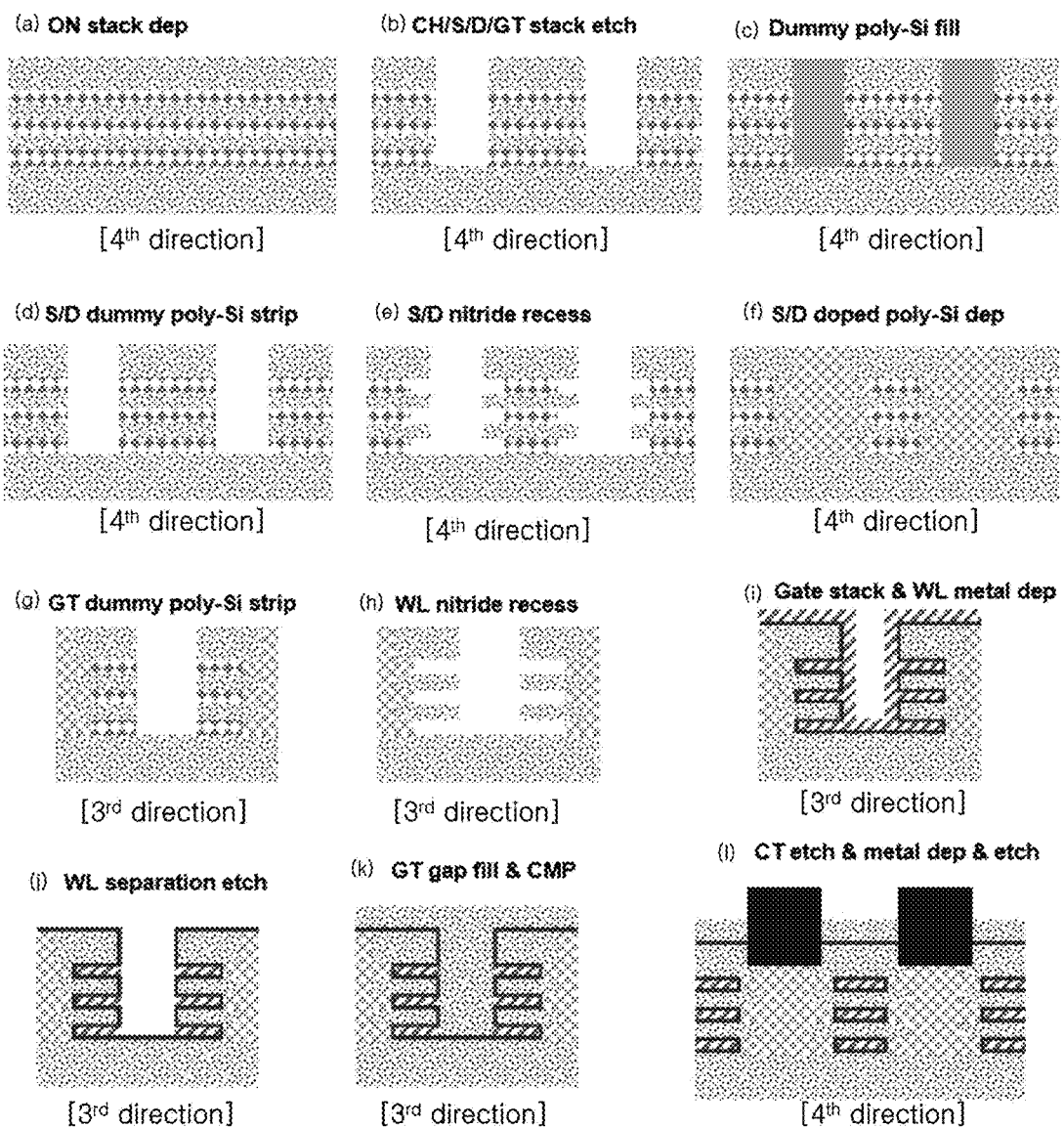
FIG. 11 is cross-sectional views and top views showing the result of each step in the manufacturing method of the 3D capacitor stack according to the second embodiment of the present invention.

FIG. 11 is cross-sectional views and top views showing the result of each step in the manufacturing method of the 3D capacitor stack according to the second embodiment of the present invention.

Referring to FIG. 11, first, first insulating layers and second insulating layers are alternately and repeatedly formed on a substrate to form a stacked structure ((a) of FIG. 11). Here, the first insulating layer and the second insulating layer are made of materials having different etch ratios. The first insulating layer may be formed of, for example, an oxide layer, and the second insulating layer may be formed of, for example, a nitride layer. By etching predetermined regions of the stacked structure using a photolithography process, an etch hole and a trench for stack isolation are simultaneously formed ((b) of FIG. 11). Next, a passivation material is filled in the etched regions of the stacked structure and the surface is planarized ((c) of FIG. 11). The passivation material may be polysilicon.

Next, the passivation material filled in the etch hole is selectively etched to expose the etch hole ((d) of FIG. 11), and the second insulating layers are selectively etched from the exposed surface of the etch hole to be recessed ((e) of FIG. 11), the drains and the drain line electrode made of a semiconductor material doped with a high concentration of impurities are formed ((f) of FIG. 11).

Next, a passivation material filled in the trench for stack isolation is selectively etched to expose the trench for stack isolation ((g) of FIG. 11). Then, after selectively etching and recessing the second insulating layers from the exposed surface of the trench for stack isolation ((h) of FIG. 11), the insulator stacks are formed on the surfaces of the recessed spaces and a conductive material to become word lines is formed ((i) of FIG. 11). Then, the conductive material is isotropically etched to form a plurality of word lines separated for each layer ((1) of FIG. 11). Then, the inside of the trench for stack isolation is filled with an oxide layer and then the surface is planarized ((k) of FIG. 11).

Next, regions for forming the wiring of the drain line electrode and the word line electrode are etched, a metal material is formed in the etched regions, and then the metal material is etched using a photolithography process to form contact regions of the drain line electrode and the word line electrode ((1) of FIG. 11). Through the above-described process, the three-dimensional capacitor stack according to the second embodiment of the present invention is completed.

Meanwhile, it is preferable that the 3D capacitor stack according to the above-described second embodiment further include a drain electrode landing pad 192 under the drain line electrode.

Figure 12:
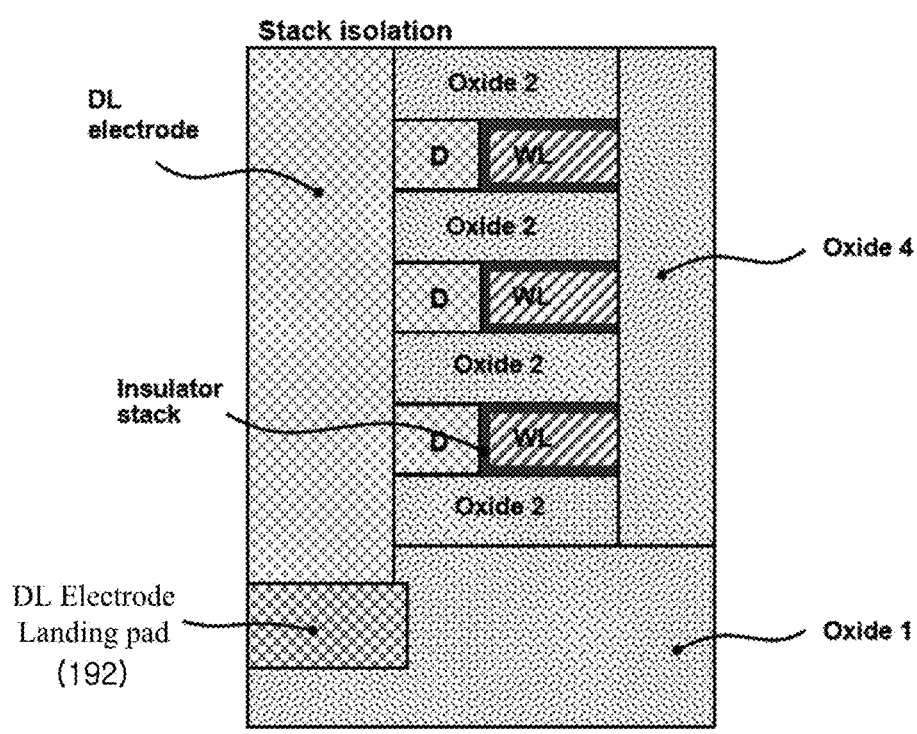
FIG. 12 is a cross-sectional view illustrating a drain electrode landing pad in a 3D capacitor stack according to a second embodiment of the present invention.

FIG. 12 is a cross-sectional view illustrating a drain electrode landing pad in a 3D capacitor stack according to a second embodiment of the present invention.

Referring to FIG. 12, the drain electrode landing pad (DL electrode landing pad) 192 is positioned on the first oxide layer positioned below the drain line electrode, and is electrically connected to the drain line electrode. The drain electrode landing pad is made of a material having electrical conductivity, and for example, it may be made of one of various metals, silicides, or semiconductor materials doped with impurities. The semiconductor material may include an amorphous semiconductor, a single crystal semiconductor, a polycrystalline semiconductor, and the like.

Figure 13:
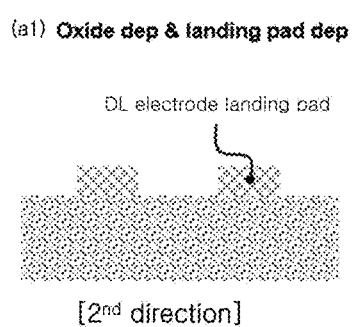
FIG. 13 is cross-sectional views illustrating results of some steps in the manufacturing method of the 3D capacitor stack of the present invention shown in FIG. 12.
Figure 13:
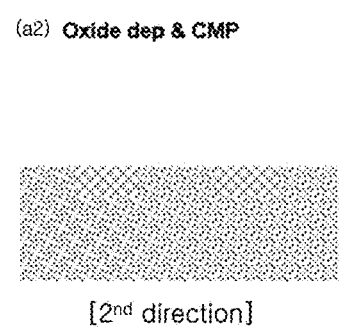
Figure 13:
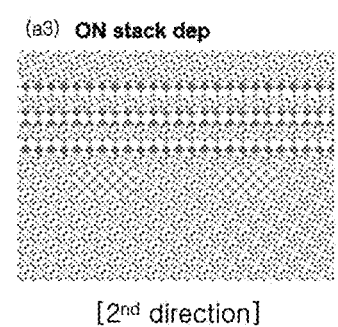

FIG. 13 is cross-sectional views illustrating results of some steps in the manufacturing method of the 3D capacitor stack of the present invention shown in FIG. 12.

Referring to FIG. 13, in the method of manufacturing a three-dimensional synapse device stack according to the present embodiment, a first oxide layer is formed on the surface of a substrate, an electrode material is formed on the first oxide layer, and then patterned to form a drain electrode landing pad ((a1) of FIG. 13). Next, an oxide material is formed on the surface of the resultant, then planarized ((a2) of FIG. 13), and first insulating layers and second insulating layers are alternately formed thereon to form a stacked structure ((a3) of FIG. 13). Thereafter, the process is the same as in FIG. 11.

EMBODIMENT 3

Figure 14:
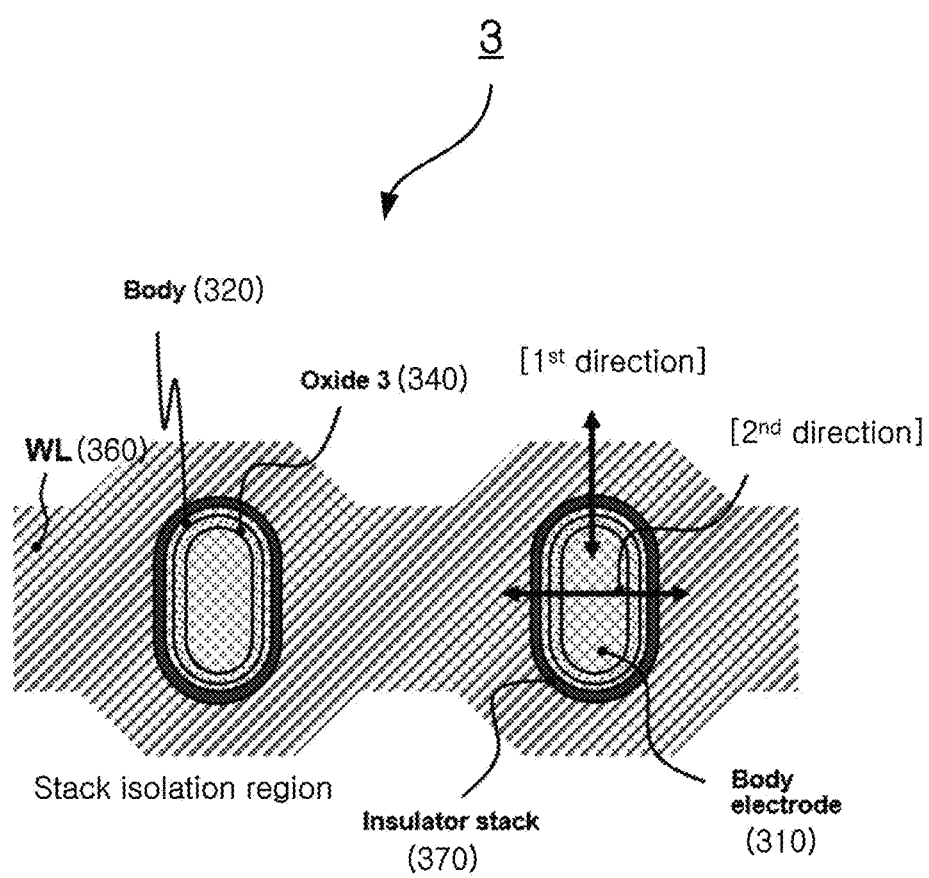
FIG. 14 is a cross-sectional view illustrating a three-dimensional capacitor stack according to a third embodiment of the present invention.
Figure 15:
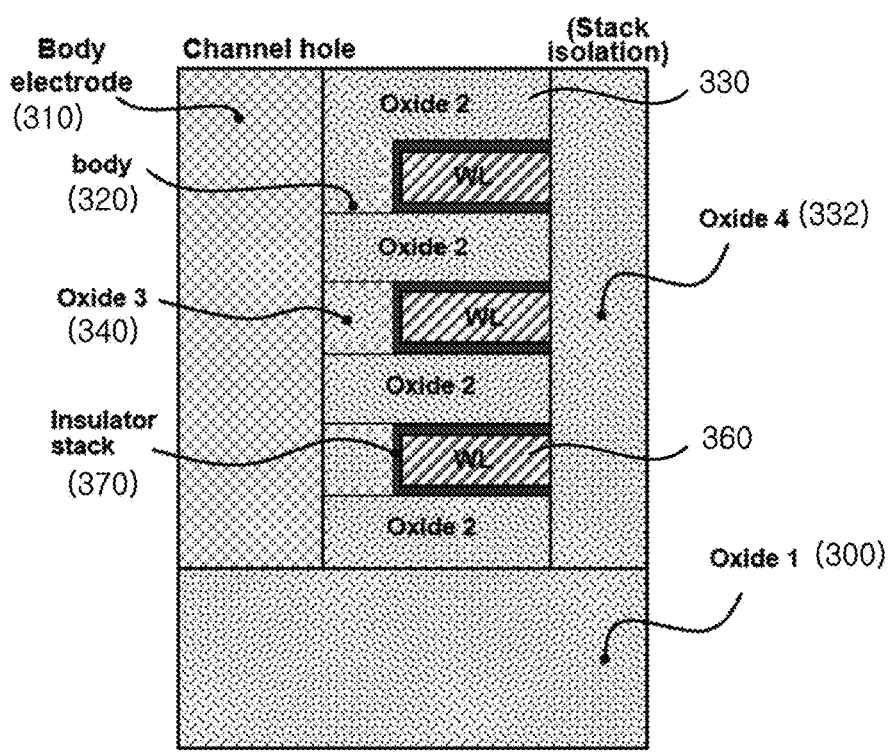
FIG. 15 is a cross-sectional view taken in the first direction of FIG. 14.

FIG. 14 is a cross-sectional view illustrating a three-dimensional capacitor stack according to a third embodiment of the present invention; and FIG. 15 is a cross-sectional view taken in the first direction of FIG. 14.

Referring to FIGS. 14 and 15, the three-dimensional capacitor stack 3 according to the third embodiment of the present invention includes a substrate (not shown), a body electrode 310, a plurality of semiconductor bodies 320, and a plurality of products, a plurality of first insulating layers 330, a plurality of third oxide layers 340, a plurality of word lines 360, and a plurality of insulator stacks 370. The third oxide layer, the semiconductor body, the insulator stack and the word line positioned on the same layer on the outer circumferential surface of the body electrode constitute a capacitor device. In addition, the capacitor devices formed in each layer are electrically isolated from each other by the second and third oxide layers and stacked in a vertical direction, thereby constituting a three-dimensional capacitor stack as a whole. The three-dimensional capacitor stack having the above-described structure is electrically isolated from the adjacent three-dimensional capacitor stack by further including a stack isolation layer 332 on side surfaces of the word lines. The stack isolation layer may be formed of a fourth oxide layer.

The substrate is formed with a first oxide layer (Oxide 1) 300 on the surface, and the three-dimensional capacitor stack according to the present invention is provided along the vertical direction on the first oxide layer 300 of the substrate.

The body electrode 310 is positioned on the surface of the substrate, is formed in a pillar shape provided in a direction perpendicular to the surface of the substrate, and is made of a semiconductor material doped with a high concentration of impurities or is made of a material having electrical conductivity.

The plurality of first insulating layers 330 are located on the outer peripheral surface of the body electrode. The plurality of third oxide layers 340 are located on the outer peripheral surface of the body electrode. The plurality of semiconductor bodies 320 are located on the surfaces of the third oxide layers, are made of a semiconductor material, and some regions of the semiconductor body are electrically connected to the body electrode. The plurality of insulator stacks 370 are located on side surfaces of the semiconductor bodies, the plurality of word lines 360 are located on side surfaces of the insulator stacks, and the word lines are surrounded by the insulator stacks and are provided on the side surface of the semiconductor body.

First insulating layers and semiconductor bodies are alternately stacked on the outer circumferential surface of the body electrode, and the first insulating layers and word lines surrounded by the insulator stacks are alternately stacked. In addition, the semiconductor body, the insulator stack, and the word line positioned on the same layer on the outer circumferential surface of the body electrode constitute a capacitor device, and the capacitor devices electrically isolated from each other by the first insulating layers are vertically stacked to form a stack structure. do. The first insulating layers electrically isolate the stacked capacitor devices from each other.

Hereinafter, a method of manufacturing a 3D capacitor stack according to a third embodiment of the present invention will be described in detail with reference to FIG. 16.

Figure 16:
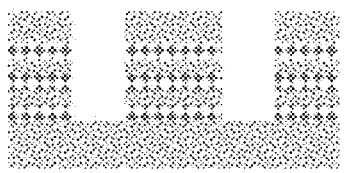
FIG. 16 is cross-sectional views illustrating a result of some steps in a method of manufacturing a 3D capacitor stack according to a third embodiment of the present invention.
Figure 16:
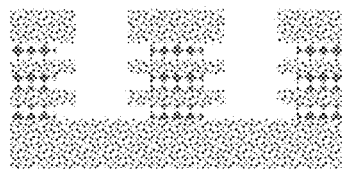
Figure 16:
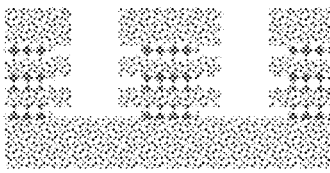
Figure 16:
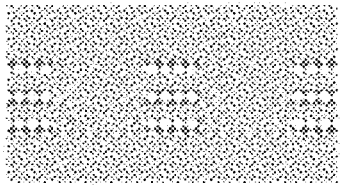
Figure 16:
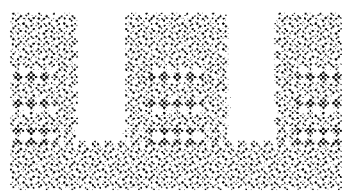
Figure 16:
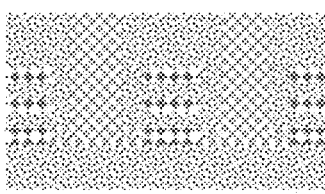

FIG. 16 is cross-sectional views illustrating a result of some steps in a method of manufacturing a 3D capacitor stack according to a third embodiment of the present invention.

First, a stacked structure is formed by alternately and repeatedly forming first insulating layers and second insulating layers on a substrate, and predetermined regions of the stacked structure are etched using a photolithography process to form an etch hole and a trench for stack isolation. Next, a passivation material is formed on the etched areas of the stacked structure, and then the surface is planarized. Next, as shown in (a) of FIG. 16, the etching hole is exposed by selectively etching the passivation material filled in the etching hole ((a) of FIG. 16), the second insulating layers are selectively etched and recessed from the exposed surface of the etch hole ((b) of FIG. 16), and a semiconductor body made of polysilicon, which is a semiconductor material, is formed ((c) of FIG. 16).

Next, the resultant is filled with an oxide material and the surface is planarized ((d) of FIG. 16), the oxide material is isotropically etched ((e) of FIG. 16), and a body electrode made of a semiconductor material is formed in the etched region ((e) of FIG. 16).

Next, through the same process as in the manufacturing method of the second embodiment, an insulator stack and a word line are formed, the inside of the trench for stack isolation is filled with an oxide layer and then the surface of the resultant is planarized, and wirings of the body electrode and the word line electrode are formed.

In the first, second and third embodiments described above, the semiconductor body may be made of a semiconductor material such as polysilicon, poly-SiGe, or metal oxide. The semiconductor body having the above-described structure is provided with a channel during device operation.

In the first, second and third embodiments described above, the insulator stack may be composed of a single layer or a stack structure in which at least two or more layers are stacked, and the insulator stack includes a layer that stores electric charges or causes polarization. When the insulator stack is composed of a single layer, it may be formed of an oxide layer, a nitride layer, or the like. And, when the insulator stack is configured in a stack structure, it may include at least a charge storage layer and an insulating layer, a ferroelectric layer and an insulating layer, a resistance change layer and an insulating layer, or a phase change layer and an insulating layer.

The insulator stack preferably has a stack structure in which a plurality of layers including at least a charge storage layer and an insulating layer are stacked, and the structure of the insulator stack may be implemented in various embodiments. On the other hand, when the insulator stack includes a charge storage layer and an insulating layer, preferably the insulating layer is not disposed between the semiconductor body and the charge storage layer, or an insulating layer is disposed with a thickness of 4 nm or less even if disposed, thereby the operating voltage of programming or erasing can be lowered.

In addition, the insulator stack may be configured by stacking a plurality of insulating layers. In this case, at least one of the insulating layers constituting the insulator stack includes an insulating layer having a trap for enabling charge storage, and the insulating layer operates as a charge storage layer, so that the device can implement a memory function for storing information in a non-volatile form. For example, the insulator stack may have a stacked structure of a first insulating layer, a charge storage layer, and a second insulating layer, or a stacked structure of an insulating layer and a charge storage layer. Here, the insulating layer of the insulator stack may use silicon oxide, aluminum oxide, or the like, and the charge storage layer may use silicon nitride, hafnium oxide, or the like.

In addition, at least one of the insulating layers constituting the insulator stack may implement a memory function for storing information in a non-volatile form using a polarization-inducing material. For example, the insulator stack may be provided in a stacked structure of a material layer causing polarization and an insulating layer. Here, the insulating layer of the insulator stack may be formed of silicon oxide, aluminum oxide, or the like, and a plurality of materials including hafnium oxide (HfZrOx) may be used as the polarization-inducing material.

In the second and third embodiments described above, the three-dimensional capacitor stack according to the present invention may further include an additional capacitor stack structure having the same structure on the surface opposite to the drain line electrode or the body electrode, thereby further improving the degree of integration.

In the second and third embodiments described above, it is preferable that the three-dimensional capacitor stack according to the present invention further include an anchor at a position spaced apart from the stack structure by a predetermined distance. In the process of selectively etching the second insulating layers, which is a part of the stack structure, to form the insulator stacks and the word lines during the manufacturing process of the capacitor stack, in order to prevent deformation or collapse of the structure, the anchor is provided at a portion of a position where word lines extending from the 3D capacitor stack is formed. The length, width, shape, and number of anchors can be varied in various ways depending on the structure.

Preferably, the anchor is formed by alternately and repeatedly stacking first insulating layers and second insulating layers, and is spaced apart from the 3D capacitor stack by a predetermined distance and disposed at a position where the word line wiring extends. Here, the first insulating layer and the second insulating layer are preferably made of materials having different etch ratios. Accordingly, the first insulating layer may be made of, for example, an oxide layer (Oxide 2), and the second insulating layer may be made of, for example, a nitride layer (Nitride).

The anchor may be formed in a rectangular shape on a portion of the word line extending from the capacitor stack, or formed by extending a predetermined length from the stack isolation layer of the 3D capacitor stack in the longitudinal direction of the 3D capacitor stack.

In the above, the present invention has been described with respect to the preferred embodiment thereof, but this is only an example and does not limit the present invention. It will be appreciated that various modifications and applications not exemplified above are possible within the scope. And, the differences related to such modifications and applications should be construed as being included in the scope of the present invention defined in the appended claims.

What is claimed is:

1. A three-dimensional capacitor stack, which comprises:
    a substrate having an upper surface formed of a first oxide layer;
    a channel hole positioned on the substrate in a vertical direction and provided in a form of a pillar shape, the inside of which is filled with an insulating material;
    a semiconductor body positioned on the outer circumferential surface of the channel hole and made of a semiconductor material;
    a plurality of first insulating layers positioned on an outer circumferential surface of the semiconductor body;
    a plurality of sources positioned on a first side surface of an outer circumferential surface of the semiconductor body;
    a plurality of drains positioned on a second side surface of an outer circumferential surface of the semiconductor body opposite to the first side surface;
    a plurality of word lines positioned on a third side surface of the outer peripheral surface of the semiconductor body located between the sources and the drains;
    a plurality of insulator stacks positioned between the word lines and the semiconductor body;
    a source line electrode positioned on a substrate in a vertical direction, provided in a form of a pillar shape, and electrically connected to the plurality of sources; and
    a drain line electrode positioned on a substrate in a vertical direction, provided in a form of a pillar shape, and electrically connected to the plurality of drains,
    wherein the first insulating layers and the sources are alternately stacked on a first side surface of the outer peripheral surface of the semiconductor body, the first insulating layers and drains are alternately stacked on the second side surface of the outer peripheral surface of the semiconductor body, and the first insulating layers and word lines surrounded by the insulator stacks are alternately stacked on the third side of the outer circumferential surface of the semiconductor body;

the semiconductor body, the source, the drain, the word line and the insulator stack located on the same layer on the side of the channel hole constitute a capacitor device; and the capacitor devices electrically isolated from each other by the first insulating layers are vertically stacked to form a stack structure.

2. The three-dimensional capacitor stack according to claim 1, wherein regions in which the capacitor devices are formed among the side surfaces of the channel hole protrude and extend toward the sources, drains, and word lines, the semiconductor body is provided only on the side surface of the protruding and extended channel hole and is not provided on the non-protruding side surface of the channel hole, so that adjacent word lines of capacitor devices stacked in a stack structure are electrically isolated from each other.

3. The three-dimensional capacitor stack according to claim 1, which further comprises an anchor that is disposed on a substrate spaced apart from the stack structure by a predetermined distance, and is formed by stacking a plurality of second insulating layers alternately with the plurality of first insulating layers.

4. The three-dimensional capacitor stack according to claim 3, wherein the first insulating layer and the second insulating layer are made of materials having different etch ratios.

5. The three-dimensional capacitor stack according to claim 1, wherein the insulator stack is composed of a single insulating layer or a stack structure in which a plurality of layers are stacked; and when configured in a stack structure, the insulator stack comprises at least a charge storage layer and an insulating layer, at least a ferroelectric layer and an insulating layer, at least a resistance change layer and an insulating layer, or at least a phase change layer and an insulating layer.

6. The three-dimensional capacitor stack according to claim 5, wherein the three-dimensional capacitor stack is configured to change the capacitance value of the capacitor by providing positive or negative charges in the charge storage layer.

7. The three-dimensional capacitor stack according to claim 1, which further comprises:
a body landing pad located in the first region of the first oxide layer, made of an electrically conductive material, and electrically connected to the semiconductor body;
a source electrode landing pad located in the second region of the first oxide layer, made of an electrically conductive material, and electrically connected to a source line electrode; and
a drain electrode landing pad located in a third region of the first oxide layer, made of an electrically conductive material, and electrically connected to a drain line electrode.

8. A three-dimensional capacitor stack, which comprises:
a substrate having an upper surface formed of a first oxide layer;
a drain line electrode positioned on the substrate in a vertical direction, provided in a form of a pillar shape, and made of a conductive material;
a plurality of first insulating layers positioned in first regions of an outer circumferential surface of the drain line electrode;
a plurality of drains positioned in second regions of an outer peripheral surface of the drain line electrode;
a plurality of insulator stacks positioned on side surfaces of the drain; and
a plurality of word lines positioned on side surfaces of the insulator stacks,
wherein the word lines surrounded by the insulator stacks are located on the side of the drain, first insulating layers and drains are alternately stacked on the outer circumferential surface of the drain line electrode, and the word lines surrounded by the insulator stacks and the first insulating layers are alternately stacked;
the drain, the word line and the insulator stack located on the same layer on the outer circumferential surface of the drain line electrode constitute a capacitor device; and
the capacitor devices electrically isolated from each other by the first insulating layers are vertically stacked to form a stack structure.

9. The three-dimensional capacitor stack according to claim 8, wherein the insulator stack is composed of a single insulating layer or a stack structure in which a plurality of layers are stacked; and when configured in a stack structure, the insulator stack comprises at least a charge storage layer and an insulating layer, at least a ferroelectric layer and an insulating layer, at least a resistance change layer and an insulating layer, or at least a phase change layer and an insulating layer.

10. The three-dimensional capacitor stack according to claim 9, wherein the three-dimensional capacitor stack is configured to change the capacitance value of the capacitor by providing positive or negative charges in the charge storage layer.

11. The three-dimensional capacitor stack according to claim 9, which further comprises a drain electrode landing pad located on the first oxide layer, made of an electrically conductive material, and electrically connected to the drain line electrode.

12. The three-dimensional capacitor stack according to claim 9, which further comprises an anchor provided on the substrate at a position spaced apart from the stack structure by a predetermined distance, and formed by alternately stacking the plurality of first insulating layers and the plurality of second insulating layers, wherein the first insulating layer and the second insulating layer are made of materials having different etch ratios.

13. The three-dimensional capacitor stack according to claim 1, which further comprises a CMOS integrated circuit used as a peripheral circuit under the substrate.

14. A three-dimensional capacitor stack, which comprises:
a substrate having an upper surface formed of a first oxide layer;
a body electrode positioned on the substrate in a vertical direction, provided in a form of a pillar shape, and made of a conductive material;
a plurality of first insulating layers positioned on an outer circumferential surface of the body electrode;
a plurality of third oxide layers positioned on an outer circumferential surface of the body electrode;
a plurality of semiconductor bodies positioned on the surfaces of the third oxide layers, made of a semiconductor material, and partially in contact with the body electrode to be electrically connected;
a plurality of insulator stacks positioned on side surfaces of the semiconductor bodies; and a plurality of word lines positioned on side surfaces of the insulator stacks,
wherein the word lines surrounded by an insulator stack are provided on a side surface of the semiconductor body, the first insulating layers and the semiconductor bodies are alternately stacked on an outer circumferential surface of the body electrode, and the first insulating layers and the word lines surrounded by the insulator stack are alternately stacked;
the semiconductor body, the word line and the insulator stack located on the same layer on the outer circumferential surface of the body electrode constitutes a capacitor device; and
the capacitor devices electrically isolated from each other by the first insulating layers are vertically stacked to form a stack structure.

15. A method of manufacturing a three-dimensional capacitor stack comprising the following steps:
(a) alternately and repeatedly forming first insulating layers and second insulating layers on a substrate to form a stacked structure, etching predetermined regions of the stacked structure to form an etch hole and a trench for stack isolation, forming a passivation material in the etched regions of the stacked structure, and planarizing the surface;
(b) selectively etching the passivation material filled in the etch hole, selectively etching the second insulating layers in the etched region to be recessed, and forming the drain and drain line electrodes made of a semiconductor material doped with a high concentration of impurities; and
(c) selectively etching the passivation material filled in the trench for stack isolation, etching the second insulating layers from the exposed side of the trench for stack isolation to be recessed, forming insulator stacks on the surfaces of the recessed spaces, and forming a plurality of word lines made of a conductive material and separated by layers,
wherein capacitor devices electrically isolated from each other by the first insulating layers are vertically stacked to form a stack structure.

16. The method of manufacturing a three-dimensional capacitor stack according to claim 15, wherein in the step (a), a first oxide layer is formed on the surface of the substrate, a material for an electrode is formed on the first oxide layer and then patterned to form a drain electrode landing pad, and an oxide layer is formed on the surface of the resultant surface and then the surface is planarized, and first insulating layers and second insulating layers are alternately and repeatedly formed thereon to form a stacked structure.

17. The method of manufacturing a three-dimensional capacitor stack according to claim 16, wherein the insulator stack is composed of a single insulating layer or a stack structure in which a plurality of layers are stacked; and when configured in a stack structure, the insulator stack comprises at least a charge storage layer and an insulating layer, at least a ferroelectric layer and an insulating layer, at least a resistance change layer and an insulating layer, or at least a phase change layer and an insulating layer.

18. The method of manufacturing a three-dimensional capacitor stack according to claim 16, wherein in the step (a), in order to provide an anchor made of the multilayer structure at a predetermined location spaced apart from the stack structure by a predetermined distance, an etch hole is not formed in the predetermined area of the stack structure.

19. The method of manufacturing a three-dimensional capacitor stack according to claim 16, wherein the first insulating layer and the second insulating layer are made of materials having different etch ratios.

20. A method of manufacturing a three-dimensional capacitor stack comprising the following steps:
(a) alternately and repeatedly forming first insulating layers and second insulating layers on a substrate to form a stacked structure, etching predetermined regions of the stacked structure to form an etch hole and a trench for stack isolation, forming a passivation material in the etched regions of the stacked structure, and planarizing the surface;
(b) selectively etching the passivation material filled in the etch hole, selectively etching the second insulating layers from the surface of the etched region to be recessed, and forming a semiconductor body made of a semiconductor material doped with a high concentration of impurities;
(c) forming third oxide layers by filling, planarizing, and isotropically etching the etch hole in which the semiconductor body is formed;
(d) forming a body electrode made of a conductive material in the etch hole;
(e) selectively etching the passivation material filled in the trench for stack isolation, selectively etching second insulating layers from the exposed surface of the trench for stack isolation to be recessed, forming insulator stacks on the surfaces of the recessed spaces, and forming a plurality of word lines made of a conductive material and separated by layers,
wherein capacitor devices electrically isolated from each other by the first insulating layers are vertically stacked to form a stack structure.

\* \* \* \* \*